(12) United States Patent
Donohue (10) Patent No.: US 7,010,076 B1
(45) Date of Patent: Mar. 7, 2006

(54) SYSTEMS AND METHODS FOR HOLDOVER CIRCUITS IN PHASE LOCKED LOOPS

(75) Inventor: John E. Donohue, Ridgefield, CT (US)

(73) Assignee: ADC Telecommunications, Inc., Eden Prairie, MN (US)

( * ) Notice: Subject to any disclaimer, the term of this patent is extended or adjusted under 35 U.S.C. 154(b) by 0 days.

(21) Appl. No.: 09/432,022

(22) Filed: Oct. 29, 1999

(51) Int. Cl.
H03D 3/24 (2006.01)

(52) U.S. Cl. .................................................... 375/376
(58) Field of Classification Search ............... 375/316, 375/327, 373, 374, 375, 376, 354, 371; 360/55, 360/60; 327/141, 146, 154, 155, 156
See application file for complete search history.

(56) References Cited

U.S. PATENT DOCUMENTS

| 5,319,320 | A | * | 6/1994 | Abe et al. ................... 331/1 A |
| 5,334,952 | A | * | 8/1994 | Maddy et al. ............... 331/1 A |
| 5,594,388 | A | * | 1/1997 | O'Shaughnessy et al. .. 331/1 R |
| 5,686,903 | A | * | 11/1997 | Duckworth et al. ... 340/825.22 |
| 5,950,115 | A | * | 9/1999 | Momtaz et al. ............... 455/73 |
| 6,121,844 | A | * | 9/2000 | Suzuki ......................... 331/17 |
| 6,606,364 | B1 | * | 8/2003 | Walley et al. .............. 375/376 |

FOREIGN PATENT DOCUMENTS

| EP | 0181439 | 5/1986 |
| EP | 0674392 | 9/1995 |
| JP | 56051140 | 5/1981 |
| JP | 58190135 | 11/1983 |
| WO | WO 9509485 | 4/1995 |

* cited by examiner

Primary Examiner—Mohammed Ghayour
Assistant Examiner—Pankaj Kumar
(74) Attorney, Agent, or Firm—Fogg and Associates, LLC; Jon M. Powers (57) ABSTRACT

Improved phase locked loops are described which handle momentary breaks in an input communication channel. The phase locked loops provide the capability to "hold" the output clock in a communication system at or very near the last output frequency before the loss of input data. Such phase locked loops include a differential phase detector, an electronic selector circuit, and an operational amplifier based loop filter circuit. The electronic selector circuit provides the differential output of the phase detector at a pair of inputs to the operational amplifier. A voltage controlled oscillator is coupled to an output of the operational amplifier and provides an output frequency for the phased locked loop circuit. The electronic selector circuit is operable to control the input to the operational amplifier to hold an output frequency of the voltage controlled oscillator at a substantially constant frequency.

31 Claims, 4 Drawing Sheets

SYSTEMS AND METHODS FOR HOLDOVER CIRCUITS IN PHASE LOCKED LOOPS

TECHNICAL FIELD OF THE INVENTION

The present invention relates generally to the field of telecommunications and, in particular, to systems and methods for holdover circuits in phase locked loops.

BACKGROUND

The rise in the popularity of new forms of communication systems such as the Internet has driven the need for network systems that offer greater and greater amounts of bandwidth and data control means. Prior to the explosion of the Internet's popularity, most telecommunications systems were designed with an architecture to support primarily a single service (e.g. voice calls). Today, the newer telecommunication systems must be designed for the larger bandwidth demands and data control means. These newer systems and networks must be able to provide two way synchronized transfer of video, audio and other data.

Phase locked loops are frequently used in two-way data communication systems, to generate an output clock derived from the input data. Conventionally, a phase locked loop includes a voltage controlled oscillator which provides an output frequency to serve as the clock signal. The phased locked loop uses an input data signal in conjunction with the voltage controlled oscillator to generate the output clock signal. The output clock signal can then regulate the output timing of output data signals between data processing devices and data transmitters for transmittal of data further along a data communication system.

If the input data signal is lost or interrupted then an output frequency of the voltage-controlled oscillator will generally swing to one voltage rail or the other resulting in a loss of an accurate output clock signal and potential loss of data through the communication system. To prevent the output frequency of the voltage-controlled oscillator from swinging to one voltage rail or the other some prior art systems substitute a second synchronization source or system clock to provide the synchronization for the system. For example, in the prior art, the loss of an input data signal to the phased locked loop will cause the phase locked loop to switch to a fixed voltage reference, such as substitute, fixed voltage-controlled oscillator. The problem with this prior art method is that the fixed voltage reference of the substitute voltage-controlled oscillator may be and often is significantly different from the clock frequency at which the phased locked loop was locked just prior to the input data loss. In this case, the system can still experience significant problems in that the rapid switching from one clock frequency to another will likely cause data errors.

For the reasons stated above, and for other reasons stated below which will become apparent to those skilled in the art upon reading and understanding the present specification, there is a need in the art for systems and methods for improved hold-over capability in phased locked loops to account for momentary breaks in an input communication channel.

SUMMARY

The above mentioned problems with phase locked loop circuits which handle clock frequencies in an input communication channel and other problems are addressed by the present invention and will be understood by reading and studying the following specification. Improved phase locked loops are described which provide the capability to "hold" the output clock in a communication system at or very near the last output frequency before the loss of input data. This can prevent loss of data and communication with successive locations, or minimize disruption in communication, by avoiding rapid changes in data transmission rates.

In particular, an illustrative embodiment of the present invention includes a phase locked loop which "holds" the output clock in a communication system at or very near the last output frequency before the loss of input data. The phase locked loop according to the teachings of the present invention includes a differential phase detector that receives an input signal and a feedback signal and produces a differential output signal. An electronic selector circuit is coupled to a differential output of the phase detector with an input that is responsive to a detected state of the input signal. An operational amplifier based loop filter circuit is provided in the phased locked loop. The electronic selector circuit provides the differential output of the phase detector at a pair of inputs to the operational amplifier. A voltage controlled oscillator is coupled to an output of the operational amplifier and provides an output frequency for the phased locked loop circuit. The electronic selector circuit is operable to control the input to the operational amplifier to hold an output frequency of the voltage controlled oscillator at a substantially constant frequency. In one embodiment of the present invention, the electronic selector circuit includes a switch which couples the pair of inputs together when a reference signal, or input signal to the phase detector is interrupted. In another embodiment of the present invention, the electronic selector circuit includes a logic-based selector circuit which holds the pair of inputs to an identical potential level when the input signal to the phase detector is interrupted.

DETAILED DESCRIPTION

The following detailed description refers to the accompanying drawings which form a part of the specification. The drawings show, and the detailed description describes, by way of illustration specific illustrative embodiments in which the invention may be practiced. These embodiments are described in sufficient detail to enable those skilled in the art to practice the invention. Other embodiments may be used and logical, mechanical and electrical changes may be made without departing from the scope of the present invention. The following detailed description is, therefore, not to be taken in a limiting sense.

Figure 1:
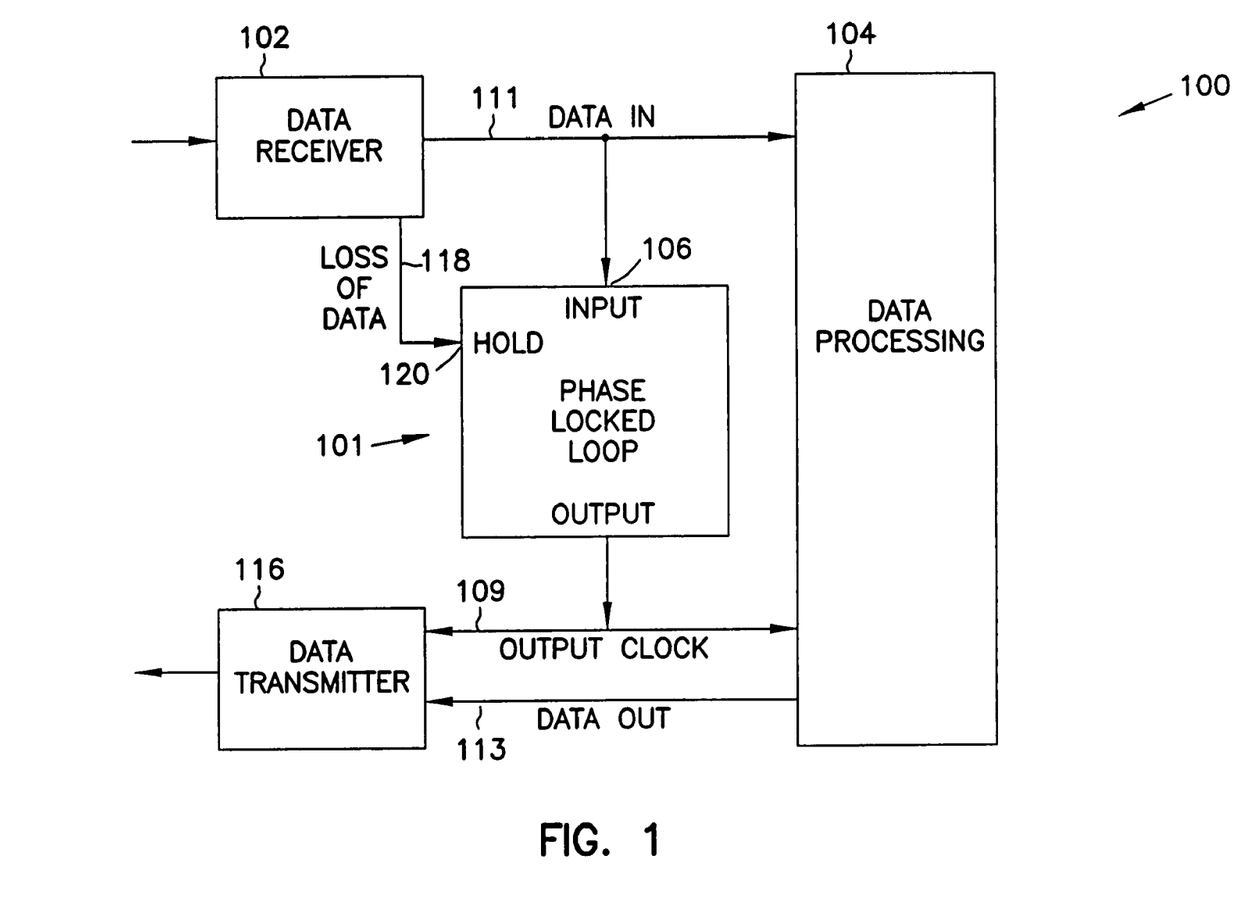
FIG. 1 is a block diagram illustrating a system level embodiment of a phase locked loop circuit according to the teachings of the present invention.

FIG. 1 is a block diagram illustrating a system 100 level embodiment of a phase locked loop circuit 101 according to the teachings of the present invention. FIG. 1 provides an overview, or framework, of the operating environment, e.g. a data communication system 100, for the present invention.

In FIG. 1, a data receiver 102 receives input data which is forwarded to a data processing device 104 and to an input 106 of the phased locked loop 101. The phased locked loop 101 includes a voltage-controlled oscillator, not shown, which produces an output frequency, or output clock signal 109. The phased locked loop 101 uses the input data signal 111 to generate the output clock signal 109. The output clock signal 109 then regulates the output of an output data signal 113 between the data processing device 104 and a data transmitter 116 for transmittal of data further along the communication system 100. Thus, the phased locked loop output is used as the clock for the data processing and the transmitter.

As shown in FIG. 1 according to the teachings of the present invention, if the input data signal 111 is lost or interrupted then an electronic selector circuit within the phased locked loop, not shown, is operable to control the input to the operational amplifier to hold an output frequency of the voltage controlled oscillator at a substantially constant frequency. This avoids having the output of the voltage controlled oscillator swing to one rail or another when the input data signal 111 is interrupted. The present invention further avoids switching the clock signal to an output frequency which is not generated from a most recently received input data signal 111.

Figure 2:
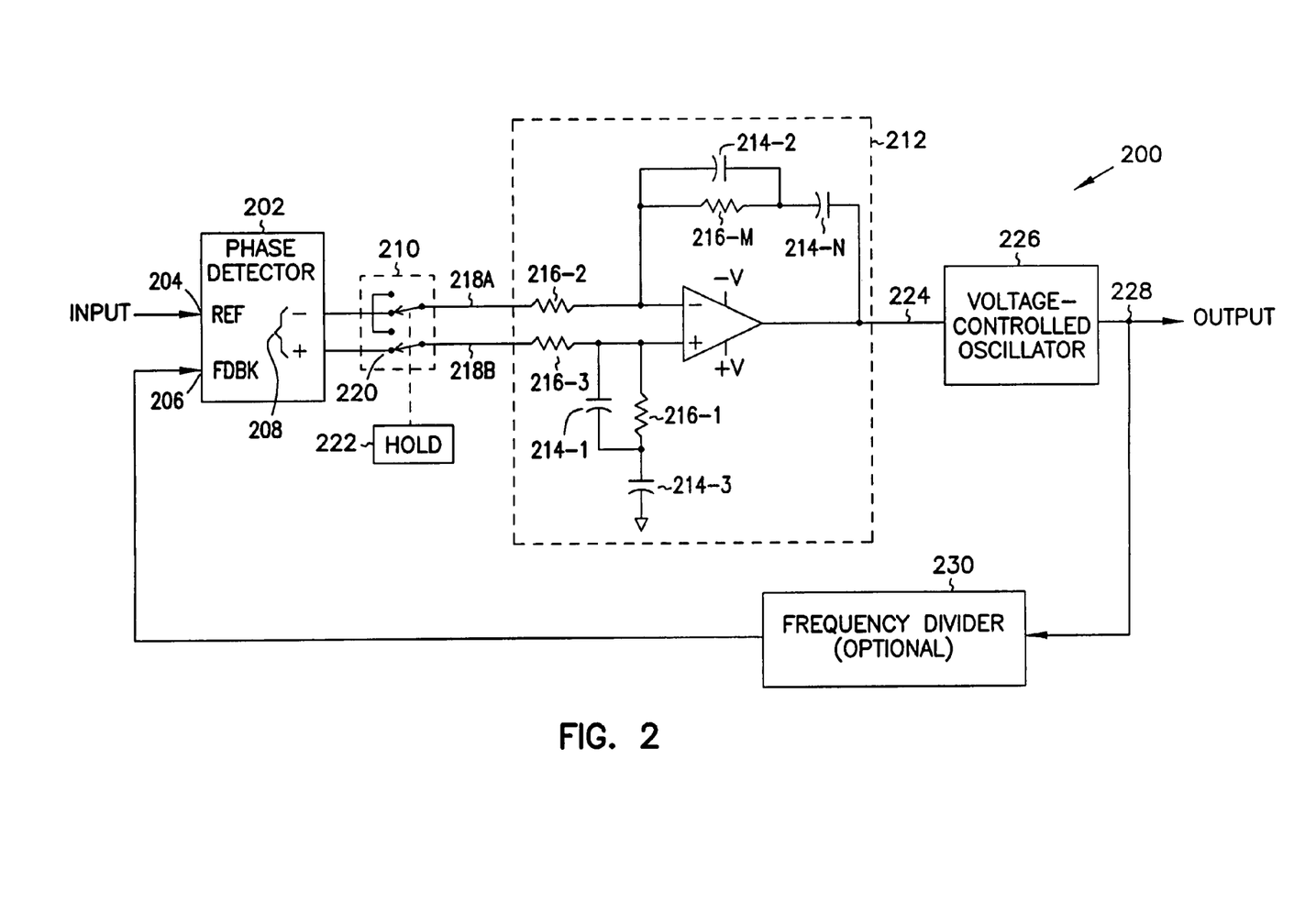
FIG. 2 is a diagram illustrating an embodiment of a phase locked loop circuit according to the teachings of the present invention.

FIG. 2 is a diagram illustrating an embodiment of a novel phase locked loop circuit 200 according to the teachings of the present invention. As shown in FIG. 2, the novel phase locked loop circuit 200 includes a differential phase detector 202. The differential phase detector 202 has a reference input 204 and a feedback input 206 that receive an input signal and a feedback signal and produces a differential output signal 208. By way of example, and not by way of limitation, the reference input 204 is adapted to receive data input signals in a communication system and the feedback input is adapted to receive feedback signals from a voltage controlled oscillator. The differential output 208 of the differential phase detector 202 is coupled to an electronic selector circuit 210, e.g. an analog switch, logic gates or other appropriate circuitry for selecting between signals. The electronic selector circuit 210 has an input that is responsive to a detected state of the input signal. The novel phase locked loop circuit 200 includes an operational amplifier based loop filter circuit 212. One of ordinary skill in the art will understand upon reading this disclosure the various means by which an operational amplifier based loop filter circuit 212 having capacitors, 214-1, 214-2, . . . , 214-N, and resistors, 216-1, 216-2, 216-3, . . . , 216-M, can be constructed to provide a suitable operational amplifier based loop filter circuit 212. One such configuration is shown by way of illustration, and not by way of limitation, in FIG. 2.

According to the teachings of the present invention, the electronic selector circuit 210 provides the differential output 208 of the phase detector 202 at a pair of inputs, 218A and 218B, to the operational amplifier 212. As shown in FIG. 2, in one embodiment, the electronic selector circuit 210 includes a switch 220 which is further coupled to an external command signal source 222.

As shown in FIG. 2, an output 224 of the operational amplifier based loop filter 212 is coupled to a voltage-controlled oscillator 226. Further, the voltage-controlled oscillator 226 provides an output frequency 228. The output frequency 228 is coupled to the feedback input 206 of the differential phase detector 202. In one embodiment, the output frequency 228 of the voltage-controlled oscillator 226 can be coupled to the feedback input 206 of the differential phase detector 202 through a frequency divider 230. According to the teachings of the present invention, the output 224 of the operational amplifier based loop filter 212 serves as an input to, or drives, the voltage-controlled oscillator 226 to generate output 228. Output 228 is used as an output frequency 228 for a system clock coupled to a number of system modules connected to the phased locked loop circuit 200, e.g. in a communication system.

In operation, the electronic selector circuit 210 of the phased locked loop circuit 200 is operable to control the input to the operational amplifier 212 to hold an output frequency 228 of the voltage controlled amplifier 226 at a substantially constant frequency. For example, as shown in FIG. 2, the electronic selector circuit 210 can hold an output frequency 228 of the voltage controlled oscillator 226 under an external command signal from the external command signal source 222 when an input signal received at the reference input 204 of the phase detector 202 is interrupted. In other words, when the input signal received at the reference input 204 of the phase detector 202 is interrupted the external command signal source 222 detects the interruption, e.g. a first detected state, and the external command signal source 222 then provides the external command signal which operates on the electronic switch 220 of the electronic selector circuit 210. The electronic switch 220 de-couples the pair of inputs 218A and 218B from the differential output 208 of the phase detector 202. The electronic switch 220 holds an output 224 of the operational amplifier based loop filter 212 to an output 224 generated by a last received signal from the phase detector 202 by coupling the pair of inputs, 218A and 218B, together. Since the output 224 of the operational amplifier 212 serves as the input to the voltage-controlled oscillator 226 which provides output 228, the output frequency 228 is similarly held to an output frequency 228 generated by a last received input signal to phase detected 202 before signal interruption. Coupling the pair of inputs, 218A and 218B, together holds a current signal input to the operational amplifier 212. In effect, the electronic selector circuit 210 holds a current signal input to the operational amplifier 212 by coupling the pair of inputs, 218A and 218B, at the same potential.

According to the teachings of the present invention, the electronic selector circuit 210 re-couples the pair of inputs, 218A and 218B, to the differential output 208 of the phase detector 202 under instruction from the external command signal provided by the external command signal source 222 when an input signal is restored or re-gained at the reference input 204 of the phase detector 202. As one of ordinary skill in the art will understand upon reading this disclosure, the present invention provides a very gradual switch in the output 224 of the operational amplifier 212, holding the frequency at output 228 where it was last when the input signal is lost, and gradually adjusting to a new input signal when the input signal is regained since the operational amplifier based loop filter 212 provides a gradual time constant for any change.

Figure 3:
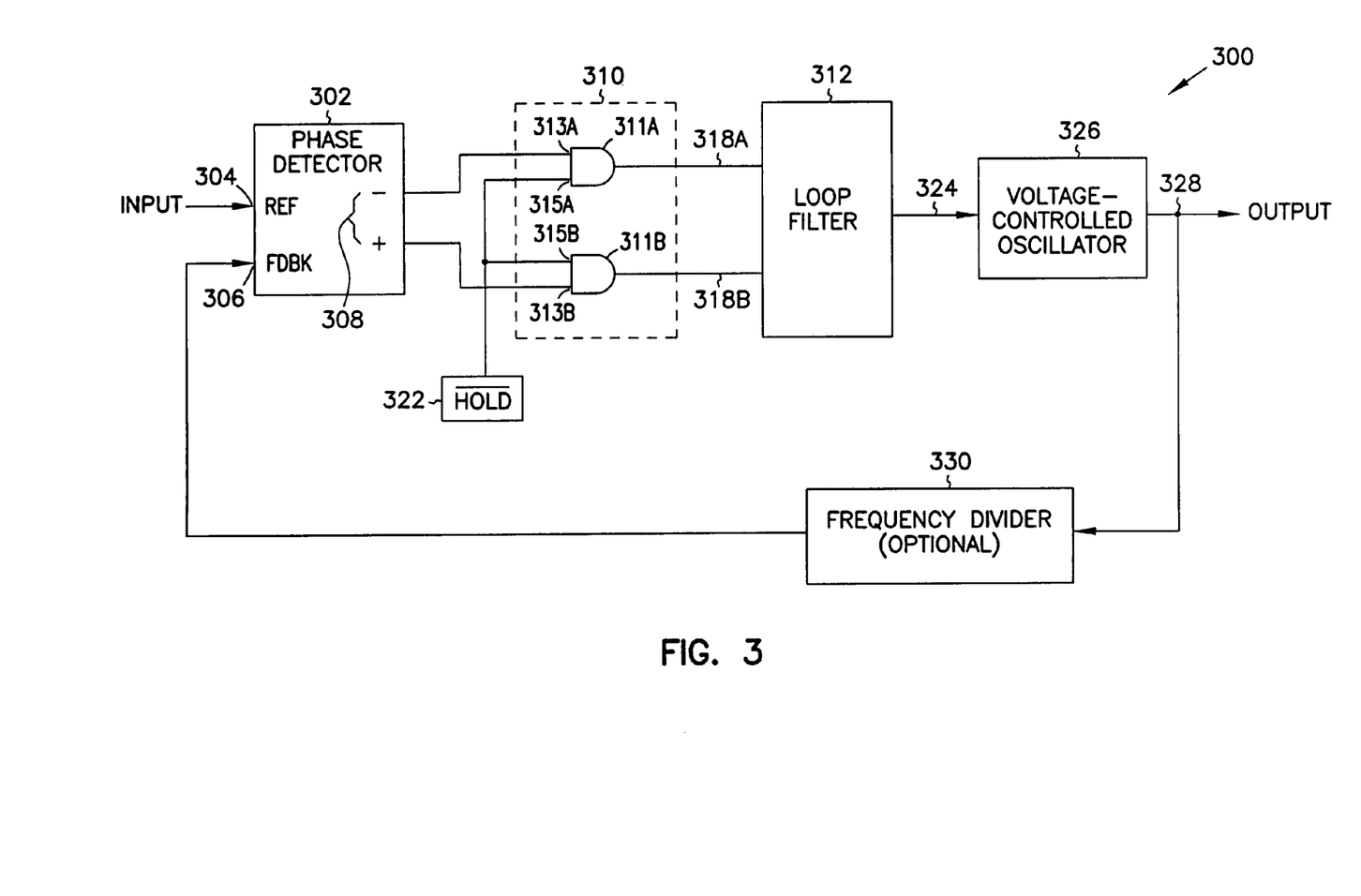
FIG. 3 is a diagram illustrating another embodiment of a phase locked loop circuit according to the teachings of the present invention.

FIG. 3 is a diagram illustrating another embodiment of a novel phase locked loop circuit 300 according to the teachings of the present invention. As shown in FIG. 3, the novel phase locked loop circuit 300 includes a differential phase detector 302. The differential phase detector 302 has a reference input 304 and a feedback input 306 that receive an input signal and a feedback signal and produces a differential output signal 308. By way of example, and not by way of limitation, the reference input 304 is adapted to receive data input signals in a communication system and the feedback input 306 is adapted to receive feedback signals from a voltage controlled oscillator. The differential output 308 of the differential phase detector 302 is coupled to an electronic selector circuit 310, e.g. an analog switch, logic gates or other appropriate circuitry for selecting between signals. The electronic selector circuit 308 has an input that is responsive to a detected state of the input signal. The novel phase locked loop circuit 300 includes an operational amplifier based loop filter circuit 312. One of ordinary skill in the art will understand upon reading this disclosure the various means by which an operational amplifier based loop filter circuit 312, having capacitors and resistors as described in connection with FIG. 2, can be constructed to provide a suitable operational amplifier based loop filter circuit 312.

According to the teachings of the present invention, the electronic selector circuit 310 provides the differential output 308 of the phase detector 302 at a pair of inputs, 318A and 318B, to the operational amplifier 312. As shown in FIG. 3, the electronic selector circuit 310 includes a logic-based selector 310 which is further coupled to an external command signal source 322 and holds the pair of inputs, 318A and 318B, to an identical potential level when a reference signal at the reference signal input 304 of the phase detector 302 is interrupted.

In one embodiment of the present invention, shown by way of illustration and not by way of limitation in FIG. 3, the logic based selector 310 includes a pair of AND gates, 311A and 311B. Each AND gate, 311A and 311B, has an output coupled to one of the pair of inputs, 318A and 318B, of the operational amplifier 312. According to the teachings of the present invention, one input, 313A and 313B, of each AND gate, 311A and 311B, is coupled to the differential output 308 of the phase detector 302. The other input, 315A and 315B, of each AND gate, 311A and 311B, is coupled to an external command signal source 322. In this embodiment, the external command signal source 322 provides a high potential to one input, e.g. 315A and 315B, of each AND gate, 311A and 311B.

In one embodiment of the present invention, as shown in FIG. 3, an output 324 of the operational amplifier based loop filter 312 is coupled to a voltage-controlled oscillator 326. Further, an output 328 of the voltage-controlled oscillator 326 is coupled to the feedback input 306 of the differential phase detector 302. In one embodiment, the output 328 of the voltage-controlled oscillator 326 can be coupled to the feedback input 306 of the differential phase detector 302 through a frequency divider 330. According to the teachings of the present invention, the output 328 of the voltage-controlled oscillator 326 is used as an output frequency 328 for a system clock coupled to a number of system modules connected to the phased locked loop circuit 300, e.g. in a communication system.

In operation, the electronic selector circuit 310 of the phased locked loop circuit 300 is operable to control the input to the operational amplifier 326 to hold an output frequency 328 of the voltage controlled oscillator 326 at a substantially constant frequency. For example, as shown in FIG. 3, the electronic selector circuit 310 can hold an output frequency 328 of the voltage controlled oscillator 326 under an external command signal from the external command signal source 322 when an input signal received at the reference input 304 of the phase detector 302 is interrupted. The external command signal source 322 operates to detect the interruption, e.g. a first detected state, and the external command signal provided by the external command signal source 222 operates on the logic based selector circuit 310. The logic based selector circuit 310 de-couples the pair of inputs, 318A and 318B, from the differential output 308 under instruction from the external command signal. The logic based selector circuit 310 holds an output 324 of the operational amplifier based loop filter 312 to an output level generated by a last received signal from the differential output 308 by coupling the pair of inputs, 318A and 318B, to the same potential level. Since the output 324 of the operational amplifier 312 serves as the input to the voltage-controlled oscillator 326 which provides output 328, the output frequency 328 is similarly held to an output frequency 328 generated by a last received input signal to phase detected 302 before signal interruption. Coupling the pair of inputs, 318A and 318B, to the same potential level holds a current signal input to the operational amplifier 312. In effect, the electronic selector circuit 310 holds a current signal input to the operational amplifier 312 by coupling the pair of inputs, 318A and 318B, at the same potential.

For example, in the embodiment shown in FIG. 3, if the input signal to the reference input 304 is lost, then 315A and 315B, each go low based on the external command signal provided by the external command signal source 322. This effectively connects the pair of inputs, 318A and 318B, of the operational amplifier 312 to the same potential, e.g. a low logic level.

According to the teachings of the present invention, the electronic selector circuit 310 will re-couple the pair of inputs, 318A and 318B, to the differential output 308 of the phase detector 302 under instruction from the external command signal provided by the external command signal source 322 when a reference signal is restored or re-gained, e.g. a second detected state, at the reference input 304 of the phase detector 302. In other words, when a reference signal is restored or re-gained at the reference input 304 of the phase detector 302 inputs, 315A and 315B, each return high. This allows AND gates 311A and 311B to pass the differential output 308 of the phase detector 302 to the operational amplifier based loop filter 312.

The embodiment described in FIG. 3, affords the advantages described in connection with the phase locked loop circuit of FIG. 2. That is, as one of ordinary skill in the art will understand upon reading this disclosure, embodiment of the present invention provide a very gradual switch in the output frequency of the voltage controlled oscillator 326, holding the frequency where it was last when the input signal to the reference input is lost, and gradually adjusting to a new input signal when the input signal is regained since the operational amplifier based loop filter 312 will provide a gradual time constant for any change.

Figure 4:
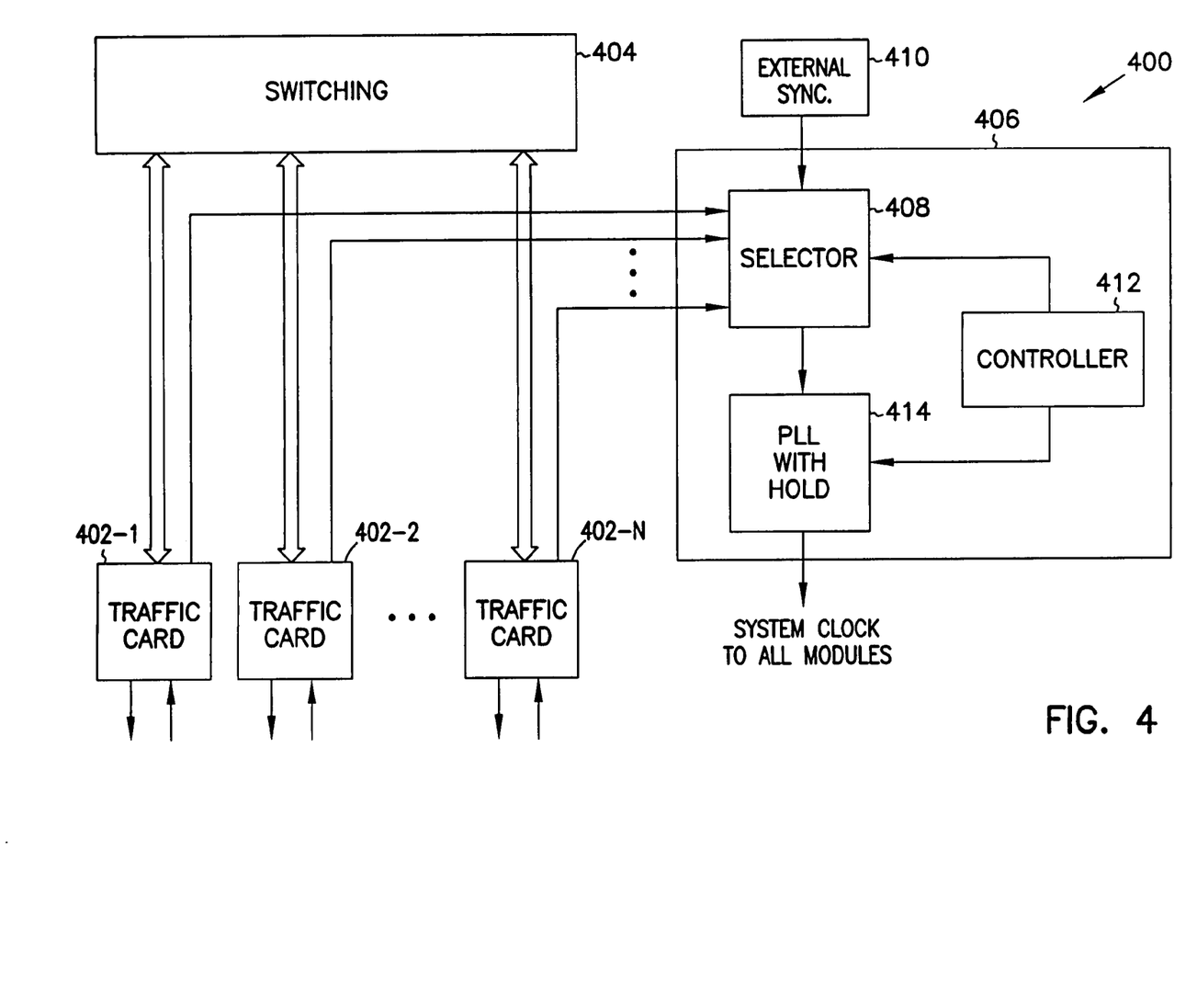
FIG. 4 is a block diagram of a communication system according to the teachings of the present invention.

FIG. 4 is a block diagram of a communication system 400 according to the teachings of the present invention. As shown in FIG. 4, the communication system 400 includes a number of traffic cards, 402-1, 402-2, . . . , 402-N, which each have inputs and outputs. A switching device 404 is coupled to the number of traffic cards, 402-1, 402-2, . . . , 402-N. A synchronization source 406 is coupled to the number of traffic cards, 402-1, 402-2, . . . , 402-N. The synchronization source 406 is determined by a selector 408 coupled to an external synchronization source 410 and a controller 412. The selector 408 provides a reference signal to a phased locked loop circuit 414. The phase locked loop circuit 414 is coupled to the controller 412. According to the teachings of the present invention, the phase locked loop circuit 414 can include the phased locked loop circuit described and discussed in detail in connection with either of FIG. 2 or 3. That is, the phase locked loop circuit 414 includes a differential phase detector, an electronic selector circuit coupled to a differential output of the phase detector, and an operational amplifier based loop filter circuit. An output of the operational amplifier is further coupled to a voltage controlled oscillator. As explained in connection with FIGS. 2 and 3, the electronic selector circuit provides the differential output of the phase detector at a pair of inputs to the operational amplifier. According to the teachings of the present invention, the electronic selector circuit de-couples the pair of inputs from the differential output and holds an output frequency of the voltage controlled oscillator to a last received input signal to the phase detector when an input signal to a reference signal input of the phase detector is interrupted.

As such, according to one embodiment of the present invention, the electronic selector circuit includes a switch which couples the pair of input signals together to hold the last received signal as a current signal input to the operational amplifier under an instruction from the controller 412 when the reference signal is interrupted. And, according to another embodiment of the present invention, the electronic selector circuit includes a logic-based selector which holds the pair of inputs to an identical potential level, under an instruction from the controller 412, to hold the last received signal from the differential phase detector when an input signal to a reference signal input of the phase detector is interrupted.

According to the teachings of the present invention, the synchronization source 406 is designed to provide an output clock frequency for data traffic in the communication system 400. In one embodiment, the synchronization source 406 can further serve as a system clock coupled to a number of system modules, e.g. switching device 404, traffic cards 402-1, 402-2, . . . , 402-N, and other modules of the communication system 400.

CONCLUSION

Improved phase locked loops have been described which handle momentary breaks in an input communication channel. The phase locked loops provide the capability to "hold" the output clock in a communication system at or very near the last output frequency before the loss of input data. Thus, the improved phase locked loops prevent the loss of data and communication with successive locations and minimize disruption in communication, by avoiding rapid changes in data transmission rates.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention.

What is claimed is:

1. A phase locked loop circuit, comprising:
  a differential phase detector that receives an input signal and a feedback signal and produces a differential output signal;
  an electronic selector circuit having:
    at least one first input coupled to the differential output signal of the phase detector; and
    a second input that is responsive to a detected state of the input signal;
  a loop filter circuit having an operational amplifier, the operational amplifier having at least one amplifier input, wherein the electronic selector circuit provides the differential output signal of the phase detector to the amplifier input;
  a voltage controlled oscillator coupled to an output of the operational amplifier and providing an output frequency for the phase locked loop circuit; and
  wherein the electronic selector circuit is operable to control the amplifier input to hold the output frequency of the voltage controlled oscillator at a substantially constant frequency when the input signal to the phase detector is interrupted.

2. The circuit of claim 1, wherein the electronic selector circuit de-couples the amplifier input from the differential output and holds the output frequency under an external command when the input signal to the phase detector is interrupted.

3. The circuit of claim 2, wherein the electronic selector circuit holds a current signal input to the operational amplifier when a reference signal to the phase detector is interrupted.

4. The circuit of claim 3, wherein the amplifier input includes a pair of amplifier inputs and wherein the electronic selector circuit holds a current signal input to the operational amplifier by coupling the pair of amplifier inputs at the same potential.

5. The circuit of claim 4, wherein the electronic selector circuit includes a switch which couples the pair of amplifier inputs together when the reference signal to the phase detector is interrupted.

6. The circuit of claim 2, wherein the amplifier input includes a pair of amplifier inputs and wherein the electronic selector circuit includes a logic-based selector circuit which holds the pair of amplifier inputs to an identical potential level when the input signal to the phase detector is interrupted.

7. The circuit of claim 2, wherein the electronic selector circuit re-couples the amplifier input to the differential output of the phase detector when the input signal is restored.

8. A phase locked loop circuit, comprising:
  a differential phase detector that receives an input signal and a feedback signal and produces a differential output signal;
  an electronic selector circuit having:
    at least one first input coupled to the differential output signal of the phase detector; and
    a second input that is responsive to a detected state of the input signal;
  a loop filter circuit having an operational amplifier, the operational amplifier having at least one amplifier input, wherein the electronic selector circuit provides the differential output signal of the phase detector to the amplifier input;
  a voltage controlled oscillator coupled to an output of the operational amplifier and providing an output frequency for the phase locked loop circuit; and
  wherein the electronic selector circuit de-couples the amplifier input from the differential output and holds the output frequency of the voltage controlled oscillator to a last received signal from the differential output when the input signal to the phase detector is interrupted.

9. The circuit of claim 8, wherein the amplifier input includes a pair of amplifier inputs and wherein the electronic selector circuit includes a switch which couples the pair of amplifier inputs together to hold the last received signal as a current signal input to the operational amplifier when the input signal is interrupted.

10. The circuit of claim 8, wherein the amplifier input includes a pair of amplifier inputs and wherein the electronic selector circuit includes a logic-based selector circuit which holds the pair of amplifier inputs to an identical potential level to hold the last received signal from the differential output at the operational amplifier when the input signal to the phase detector is interrupted.

11. The circuit of claim 10, wherein the logic based selector circuit includes a pair of AND gates, each AND gate having an output coupled to one of the pair of amplifier inputs, wherein one input of each AND gate is coupled to the differential output, and wherein the other input of each AND gate is coupled to an external command signal source.

12. The circuit of claim 11, wherein the external command signal source provides a high potential to one input of each AND gate.

13. The circuit of claim 8, wherein the electronic selector circuit re-couples the amplifier input to the differential output of the phase detector when the input signal to the phase detector is restored.

14. The circuit of claim 8, wherein the output frequency of the voltage controlled oscillator provides the feedback signal to the differential phase detector.

15. A communication system, comprising:
a number of traffic cards having traffic inputs and traffic outputs;
a switching device coupled to the number of traffic cards; and
a synchronization source, coupled to the number of traffic cards, having a selector coupled to an external synchronization source and a controller, wherein the selector provides an input signal to a phase locked loop circuit, wherein the phase locked loop circuit is coupled to the controller, and wherein the phase locked loop circuit includes:
a differential phase detector that receives the input signal and a feedback signal and produces a differential output signal;
an electronic selector circuit having:
at least one first input coupled to the differential output signal of the phase detector; and
a second input that is responsive to a detected state of the input signal;
a loop filter circuit having an operational amplifier, the operational amplifier having at least one amplifier input, wherein the electronic selector circuit provides the differential output signal of the phase detector to the amplifier input;
a voltage controlled oscillator coupled to an output of the operational amplifier and providing an output frequency for the phased phase locked loop circuit; and
wherein the electronic selector circuit de-couples the amplifier input from the differential output and holds the output frequency of the voltage controlled oscillator to a last received signal from the differential output when the input signal to the phase detector is interrupted.

16. The system of claim 15, wherein the amplifier input includes a pair of amplifier inputs and wherein the electronic selector circuit includes a switch which couples the pair of amplifier inputs together to hold the last received signal as a current signal input to the operational amplifier under an instruction from the controller when the input signal is interrupted.

17. The system of claim 15, wherein the amplifier input includes a pair of amplifier inputs and wherein the electronic selector circuit includes a logic-based selector circuit which holds the pair of amplifier inputs to an identical potential level, under an instruction from the controller, to hold the last received signal from the differential output at the operational amplifier when the input signal to the phase detector is interrupted.

18. The system of claim 17, wherein the logic based selector circuit includes a pair of AND gates, each AND gate having an output coupled to one of the pair of amplifier inputs, wherein one input of each AND gate is coupled to the differential output, and wherein the other input of each AND gate is coupled to an external command signal from the controller.

19. The system of claim 18, wherein the external command signal includes a high potential signal provided to one input of each AND gate.

20. The system of claim 15, wherein the electronic selector circuit re-couples the amplifier input to the differential output of the phase detector when the input signal is restored.

21. The system of claim 15, wherein the output frequency of the voltage controlled oscillator provides the feedback signal for the differential phase detector.

22. The system of claim 15, wherein the output frequency of the voltage-controlled oscillator further serves as a system clock to a number of system modules connected to the communication system.

23. A method for preventing data errors in a communication system, comprising:
coupling input data to a phase locked loop circuit, wherein the phase locked loop includes:
a differential phase detector that receives an input signal and a feedback signal and produces a differential output signal;
an electronic selector circuit having:
at least one first input coupled to the differential output signal of the phase detector; and
a second input that is responsive to a detected state of the input signal;
a loop filter circuit having an operational amplifier, the operational amplifier having at least one amplifier input, wherein the electronic selector circuit provides the differential output signal of the phase detector to the amplifier input; and
a voltage controlled oscillator coupled to an output of the operational amplifier and providing an output frequency for the phase locked loop circuit;
using the electronic selector circuit to control the amplifier input to hold the output frequency of the voltage controlled oscillator at a substantially constant frequency when the input signal to the phase detector is interrupted; and
using the electronic selector circuit to release control of the amplifier input so that the amplifier input follows the differential output when the input signal to the phase detector is restored.

24. The method of claim 23, wherein the amplifier input includes a pair of amplifier inputs and wherein using the electronic selector circuit to hold the output frequency of the voltage controlled oscillator at a substantially constant frequency includes using the electronic selector circuit to de-couple the pair of amplifier inputs from the differential output and hold the output frequency of the voltage controlled oscillator to a last received signal from the differential output when the input signal to the phase detector is interrupted.

25. The method of claim 24, wherein using the electronic selector circuit to de-couple the pair of amplifier inputs from the differential output includes using a switch to couple the pair of amplifier inputs together to hold the last received signal as a current signal input to the operational amplifier when the input signal is interrupted.

26. The method of claim 24, wherein using the electronic selector circuit to de-couple the pair of amplifier inputs from the differential output includes using a logic-based selector circuit to hold the pair of amplifier inputs to an identical potential level in order to hold the last received signal from the differential output at the operational amplifier when the input signal to the phase detector is interrupted.

27. The method of claim 26, wherein using a logic-based selector circuit to hold the pair of amplifier inputs to an identical potential level includes using a logic-based selector circuit having a pair of AND gates, coupling an output of each AND gate to one of the pair of amplifier inputs, coupling one input of each AND gate to the differential output, and coupling the other input of each AND gate to an external command signal source.

28. The method of claim 27, wherein using a logic-based selector having a pair of AND gates and coupling the other input of each AND gate to an external command signal source includes coupling the other input of each AND gate to a high potential.

29. The method of claim 23, wherein the amplifier input includes a pair of amplifier inputs and wherein using the electronic selector circuit to release control of the amplifier input so that the amplifier input follows the differential output includes using the electronic selector circuit to re-couple the pair of amplifier inputs to the differential output of the phase detector when the input signal is restored.

30. The method of claim 23, wherein the method further includes using the output frequency of the voltage controlled oscillator for providing the feedback signal to the differential phase detector.

31. The method of claim 23, wherein the method further includes using the output frequency of the voltage controlled oscillator as an output frequency for a system clock coupled to a number of system modules connected to the communication system.

* * * * *